United States Patent [19]
Soh

[11] Patent Number: 5,391,936
[45] Date of Patent: Feb. 21, 1995

[54] WIDE-BAND SAMPLE AND HOLD CIRCUIT

[75] Inventor: Myung J. Soh, Kyungki-Do, Rep. of Korea

[73] Assignee: Goldstar Electron Co., Ltd., Choongchungbook-Do, Rep. of Korea

[21] Appl. No.: 107,465

[22] Filed: Aug. 17, 1993

Related U.S. Application Data

[63] Continuation of Ser. No. 776,600, Oct. 11, 1991, abandoned.

[30] Foreign Application Priority Data

Oct. 15, 1990 [KR] Rep. of Korea .............. 16289/1990

[51] Int. Cl.$^6$ .................. G11C 27/02; H03K 5/159
[52] U.S. Cl. ............................ 327/94; 327/403
[58] Field of Search ............ 307/353, 352; 328/151

[56] References Cited

U.S. PATENT DOCUMENTS 3,226,650 12/1965 Higbie ................ 307/353
4,373,141 2/1983 Sanders ............... 307/353

OTHER PUBLICATIONS

G. Floom, "A Multiplexing Track-and-Hold circuit with Standard CMOS Transmission Gates" Electronics Dept. Univ. of Stockholm, Apr., 1977 18 pp.

Primary Examiner—Timothy P. Callahan
Assistant Examiner—Toan Tran
Attorney, Agent, or Firm—Blakely, Sokoloff, Taylor & Zafman

[57] ABSTRACT

A wide-band sample and hold circuit comprising an input buffer for inputting an analog input signal and buffering the inputted analog input signal, $\frac{1}{2}$ frequency divider for frequency-dividing a sample and hold clock signal by two and outputting a $\frac{1}{2}$ frequency clock signal, first switching circuit for switching in turn an output signal from said input buffer to sample and hold condensers in accordance with the $\frac{1}{2}$ frequency clock signal, second switching circuit for switching selectivel sample and hold signals from the sample and hold condensers in accordance with said $\frac{1}{2}$ frequency clock signal and transferring or block the selectively switched sample and hold signals in accordance with an inverted sample and hold clock signal, and an output buffer for buffering an output signal from said second switching circuit and outputting the buffered signal as an output signal of the sample and hold circuit. Therefore, the circuit of the present invention can have sampling and holding intervals enough to meet a variation of the wide-band analog input signal, resulting in its stabilized sampling operation, so that the capacity of the sample and condensers can be selected suitably to the circuit.

5 Claims, 4 Drawing Sheets

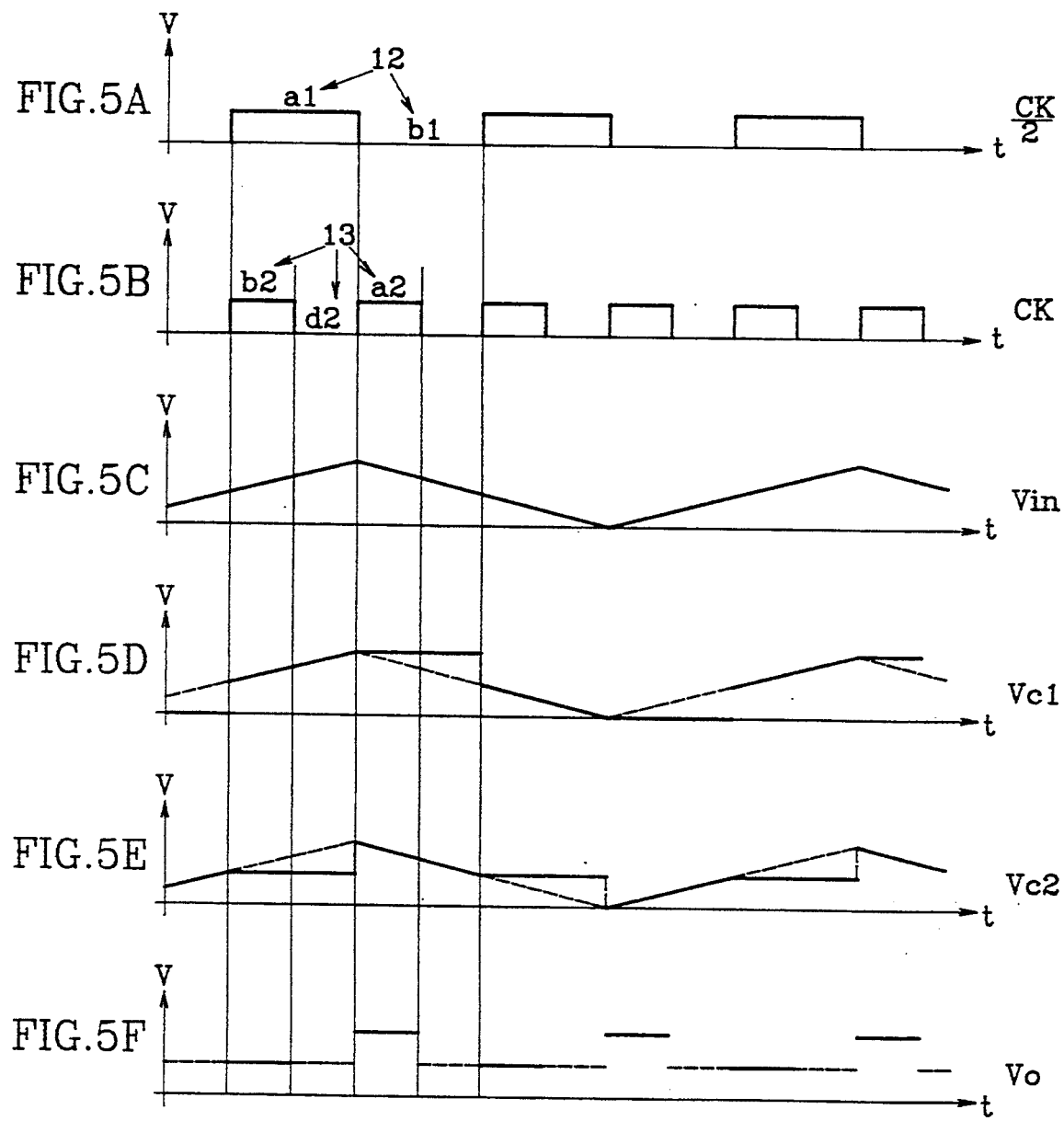

WIDE-BAND SAMPLE AND HOLD CIRCUIT

This is a continuation of application Ser. No. 07/776,600, filed Oct. 11, 1991, now abandoned.

BACKGROUND OF THE INVENTION

The present invention relates in general to a sample and hold circuit, and more particularly to a wide-band sample and hold circuit for sampling and holding an analog input signal along two paths by a ½ frequency clock signal into which a sample and hold clock signal is frequency-divided by two and outputting the sampled and held signals under a switching control, so that the circuit can have sampling and holding intervals enough to meet a variation of the wide-band analog input signal and thus its operation can be performed at high speed.

A sample and hold circuit is conventionally used as an input stage of an analog/digital converter. Namely, for the purpose of conversion of an analog signal into a digital signal, the sample and hold circuit samples the analog signal during a half period of a sample and hold clock signal and holds a level of the final sampled signal during the half period.

With reference to FIG. 1, there is shown a block diagram of a conventional sample and hold circuit. The circuit comprises an input buffer 1 for inputting an analog input signal Vin, a switch SW1 for transferring or blocking an output signal from the input buffer 1 during a predetermined period in accordance with a sample and hold clock signal $\overline{CLK}$ of the predetermined period, a sample and hold condenser C for sampling an output signal from the switch SW1 and holding a level of the final sampled signal on the turning-off of the switch SW1, and an output buffer 2 for buffering an output signal from the sample and hold condenser C and outputting an output signal Vout.

The operation of the conventional sample and hold circuit with the above-mentioned construction will now be described with reference to FIGS. 2A through 2C.

First, if the analog input signal of waveform as shown in FIG. 2B is inputted to the input buffer 1 and the sample and hold clock signal $\overline{CLK}$ is applied to the control terminal of the switch SW1 as a pulse signal of the predetermined period as shown in FIG. 2A, the switch SW1 is turned on during the period that the sample and hold clock signal $\overline{CLK}$ is low, so that the analog input signal Vin inputted through the input buffer 1 is transferred to the sample and hold condenser C; the switch SW1 is turned off during the period that the sample and hold clock signal $\overline{CLK}$ is high, so that the output from the input buffer 1 being transferred to the sample and hold condenser is blocked. As a result, the sample and hold condenser C samples the analog input signal Vin being transferred through the input buffer 1 and the switch SW1 during the period that the switch SW1 is turned on. On the other hand, during the period that the switch SW1 is turned off, the sample and hold condenser C, because of the absence of a discharging loop, holds a level of the signal finally sampled during the just previous sampling period. As a result, the sample and hold condenser C samples and holds the analog input signal Vin as shown in FIG. 2B synchronously with the sample and hold clock signal $\overline{CLK}$ and outputs a sample and hold signal Vc as shown in FIG. 2C to the output buffer 2. Then, the sample and hold signal Vc is outputted as the output signal Vout by the output buffer 2.

However, if the level of the analog input signal Vin is reduced while the operation of the sample and hold condenser C is performed during the sampling period, there is present a discharging loop wherein the voltage charged on the sample and hold condenser C is discharged through the switch SW1. For this reason, in the high speed operation wherein the period of the sample and hold clock signal $\overline{CLK}$ is short, there occurs a case where the charging and discharging speeds of the sample and hold condenser C do not meet sufficiently the variation of the analog input signal Vin. If the capacity of the sample and hold condenser C is smaller in order to solve this problem, it is difficult for the sample and hold condenser C to hold a level of the sampled signal naturally due to a leakage current during the holding period wherein the level of the sampled signal must be held during a constant interval. As a result, the sample and hold condenser C can not help having a capacity enough not to be influenced by the leakage current during the holding period. This results in a restriction of the operation at high speed.

SUMMARY OF THE INVENTION

Therefore, it is an object of the present invention to provide a wide-band sample and hold circuit for performing a sampling and holding operation, with meeting sufficiently a variation of a wide-band analog input signal in a high speed operation wherein a period of a sample and hold clock signal is short.

In accordance with the present invention, the object can be accomplished by providing a wide-band sample and hold circuit comprising: input buffering means for inputting an analog input signal and buffering the inputted analog input signal and outputting the buffered analog input signal along a plurality of sample and hold paths; frequency dividing means for frequency-dividing a sample and hold clock signal by a predetermined number and outputting the frequency-divided clock signal; first switching means for switching in turn an output signal from said input buffering means to first and second sample and hold means in accordance with said frequency-divided clock signal from said frequency dividing means; second switching means for switching selectively first and second sample and hold signals from said first and second sample and hold means in accordance with said frequency-divided clock signal from said frequency dividing means and transferring or blocking the selectively switched first and second sample and hold signals in accordance with an inverted sample and hold clock signal into which said sample and hold clock signal is inverted by an inverter gate; and output buffering means for buffering an output signal from said second switching means and outputting the buffered signal as an output signal of said sample and hold circuit.

BRIEF DESCRIPTION OF THE DRAWINGS

The above and other objects, features and advantages of the present invention will be more clearly understood from the following detailed description taken in conjunction with the accompanying drawings, in which:

FIGS. 5A through 5F are timing diagrams according to the construction of FIG. 3.

DETAILED DESCRIPTION OF PREFERRED EMBODIMENTS

Figure 1:
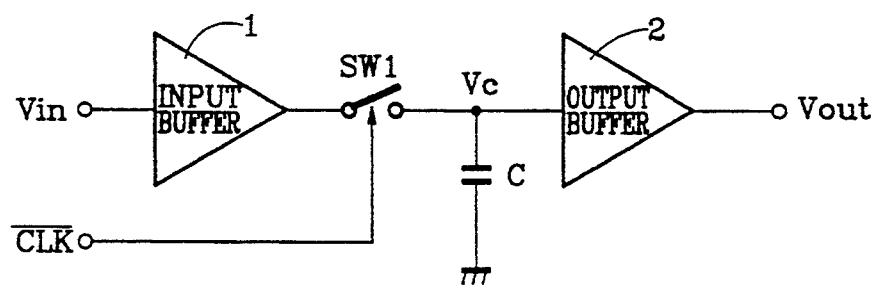
FIG. 1 is a block diagram of a conventional sample and hold circuit.
Figure 2A:
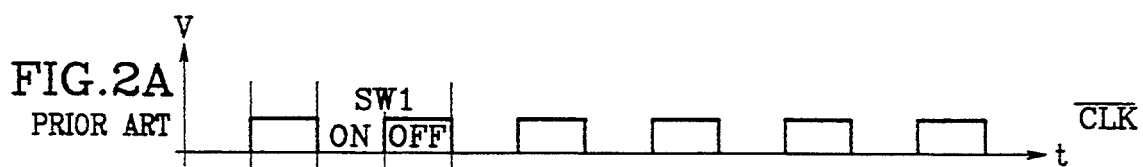
FIGS. 2A through 2C are timing diagrams according to the construction of FIG. 1.
Figure 2B:
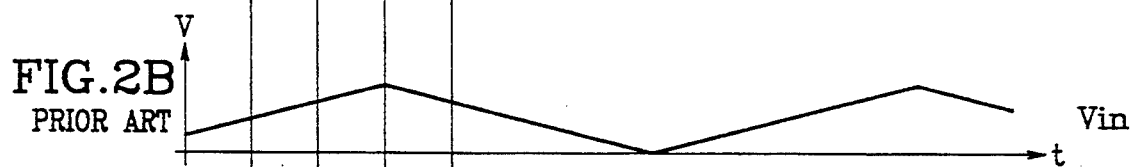
Figure 2C:
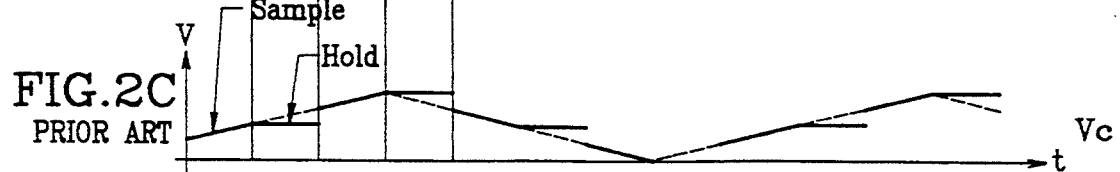
Figure 3:
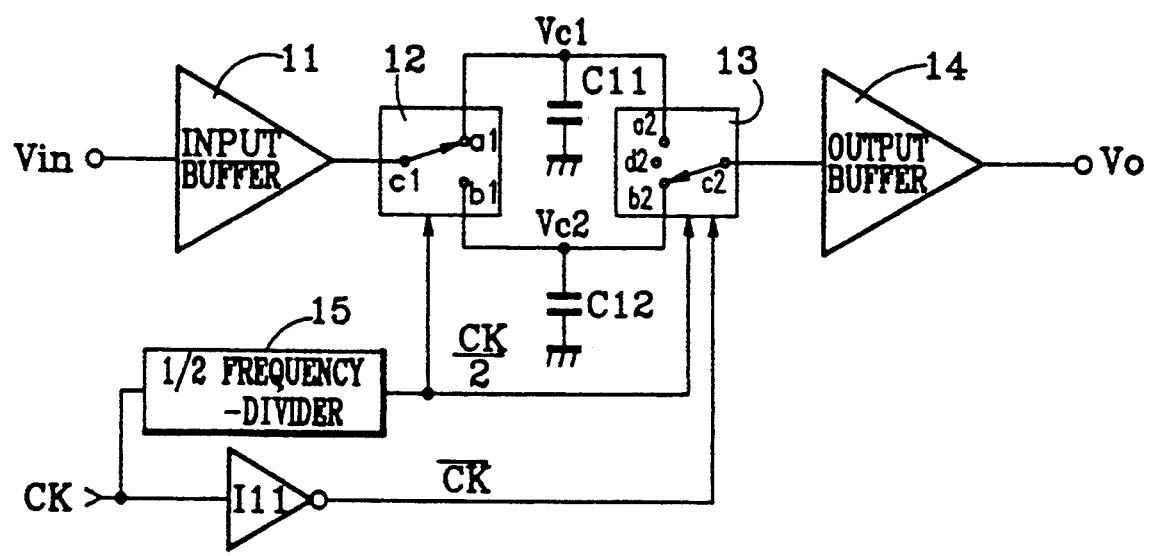
FIG. 3 is a block diagram of a sample and hold circuit of the present invention.
Figure 4:
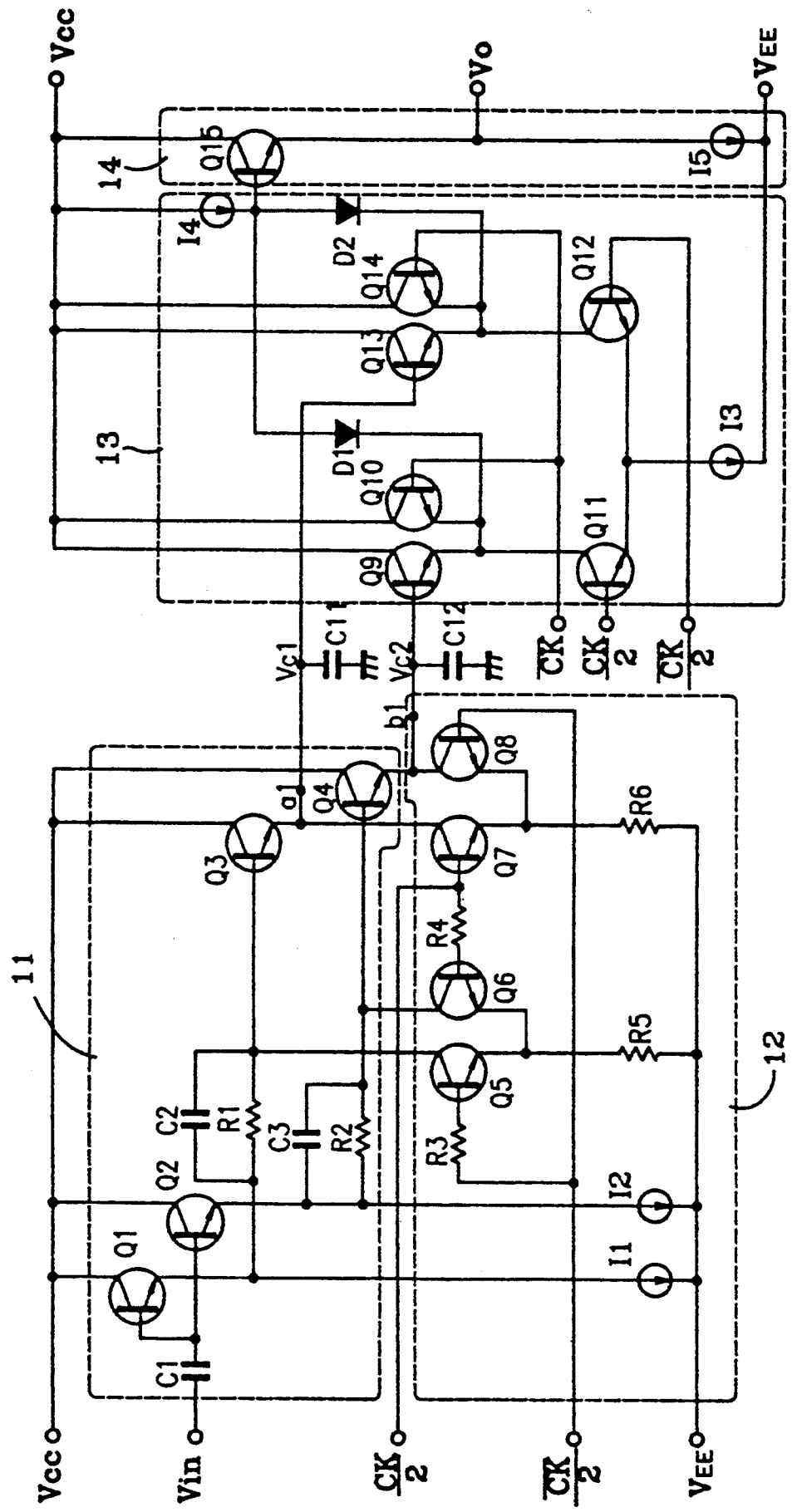
FIG. 4 is a detailed circuit diagram of an embodiment of the circuit in FIG. 3.

First, a construction of a sample and hold circuit of the present invention will be mentioned with reference to FIGS. 3 and 4.

With reference to FIG. 3, there is shown a block diagram of the sample and hold circuit of the present invention. As shown in this drawing, the sample and hold circuit of the present invention comprises an input buffer 11 for inputting an analog input signal Vin and buffering the inputted analog input signal Vin, a ½ frequency divider 15 for frequency-dividing a period of a sample and hold clock signal CK by two and outputting a ½ frequency clock signal CK/2, a first switching circuit 12 for switching in turn an output signal from the input buffer 11 to sample and hold condensers C11 and C12 in accordance with the ½ frequency clock signal CK/2 from the ½ frequency divider 15, a second switching circuit 13 for switching selectively sample and hold signals Vc1 and Vc2 from the sample and hold condensers C11 and C12 in accordance with the ½ frequency clock signal CK/2 from the ½ frequency divider 15 and transferring or blocking the selectively switched sample and hold signals Vc1 and Vc2 in accordance with an inverted sample and hold clock signal $\overline{CK}$ into which the sample and hold clock signal CK is inverted by an inverter gate I11, and an output buffer 14 for buffering an output signal from the second switching circuit 13 and outputting the buffered signal as an output signal Vo of the sample and hold circuit.

With reference to FIG. 4, there is shown a detailed circuit diagram of an embodiment of the circuit in FIG. 3. As shown in this drawing, the input buffer 11 is provided with a transistor Q1 including its base connected to an analog input signal Vin terminal via a coupling condenser C1, its collector connected to a source voltage Vcc terminal and its emitter connected to a current source I1, a transistor Q2 including its base connected to the analog input signal Vin terminal via the coupling condenser C1, its collector connected to the source voltage Vcc terminal and its emitter connected to a current source I2, a transistor Q3 including its base connected to the emitter of the transistor Q1 via parallel connected condenser and resistor 02 and R1, its collector connected to the source voltage Vcc terminal and its emitter connected to one side of the sample and hold condenser C11, the other side of which is connected to ground, and a transistor Q4 including its base connected to the emitter of the transistor Q2 via parallel connected condenser and resistor C3 and R2, its collector connected to the source voltage Vcc terminal and its emitter connected to one side of the sample and hold condenser V12, the other side of which is connected to ground.

The first switching circuit 12 is provided with transistors Q5 and Q6 including their bases connected respectively to ½ frequency clock signal $\overline{CK}$/2 and CK/2 terminals via resistors R3 and R4, their emitters connected commonly to a negative source voltage $V_{EE}$ terminal via a resistor R5 and their collectors connected respectively to base connections of the transistors Q3 and Q4, and transistors Q7 and Q8 including their bases connected respectively to the ½ frequency clock signal CK/2 and $\overline{CK}$/2 terminals, their emitters connected commonly to the negative source voltage $V_{EE}$ terminal via a resistor R6 and their collectors connected respectively to emitter connections of the transistors Q3 and Q4.

Also, the second switching circuit 13 is provided with transistors Q11 and Q12 including their emitters connected commonly to a current source I3 and their bases connected respectively to the ½ frequency clock signal CK/2 and $\overline{CK}$/2 terminals, transistors Q9 and Q10 including their collectors connected commonly to the source voltage Vcc terminal, their bases connected respectively to the one side of the sample and hold condenser C12 and an inverted sample and hold clock signal $\overline{CK}$ terminal, and their emitters connected commonly to the collector of the transistor Q11, transistors Q13 and Q14 including their collectors connected commonly to the source voltage Vcc terminal, their bases connected respectively to the one side of the sample and hold condenser C11 and the inverted sample and hold clock signal $\overline{CK}$ terminal and their emitters connected commonly to the collector of the transistor Q12, and diodes D1 and D2 including their anodes connected commonly to the source voltage Vcc terminal via a current source I4 and their cathodes connected respectively to the common emitters of the transistors Q9 and Q10 and the common emitters of the transistors Q13 and Q14, whereby the second switching circuit 13 applies the switched output to the output buffer 14 through a connection of the common anodes of the diodes D1 and D2 with the current source I4.

On the other hand, the output buffer 14 is provided with a transistor Q15 including its base connected to the common anode connection of the diodes D1 and D2, its collector connected to the source voltage Vcc terminal and its emitter connected to a sample and hold output signal Vo terminal and also connected to the negative source voltage $V_{EE}$ terminal via a connection of the emitter with the sample and hold output signal Vo terminal and via a current source I5.

Now, the operation of the sample and hold circuit with the above-mentioned construction in accordance with the present invention will be described in detail with reference to FIG. 3 and FIGS. 5A through 5F.

With reference to FIGS. 5A through 5F, there are shown timing diagrams according to the construction of FIG. 3.

First, upon receiving the sample and hold clock signal CK as shown in FIG. 5B, the ½ frequency divider 15 frequency-divides the period of the sample and hold clock signal CK by two to generate the ½ frequency clock signal CK/2 as shown in FIG. 5A. At this time, if the input buffer 11 inputs the analog input signal Vin as shown in FIG. 5C, the first switching circuit 12 transfers the output signal from the input buffer 11 to the first sample and hold condenser C11 during the period that the ½ frequency clock signal OK/2 is high; transfers the output signal from the input buffer 11 to the second sample and hold condenser C12 during the period that the ½ frequency clock signal CK/2 is low. As a result, the first sample and hold condenser C11 samples the output signal from the input buffer 11 during the period that the ½ frequency clock signal CK/2 is high and holds a level of the sampled signal during the period that the ½ frequency clock signal CK/2 is low, as shown in FIG. 5D. On the other hand, the second sample and hold condenser C12 samples the output signal from the input buffer 11 during the period that the ½ frequency clock signal CK/2 is low and holds a level of the sampled signal during the period that the ½ frequency clock signal CK/2 is high, as shown in FIG. 5E.

In this manner, the first and second sample and hold condensers C11 and C12 sample and hold the analog input signal Vin, alternately, in accordance with the ½ frequency clock signal CK/2, as shown in FIGS. 5D and 5E, and output respectively the sample and hold signals Vc1 and Vc2. These sample and hold signals Vc1 and Vc2 are selectively switched by the second switching circuit 13 in accordance with the ½ frequency clock signal CK/2 and the sample and hold clock signal $\overline{CK}$ inverted by the inverter gate I11. That is, the second switching circuit 13 selects the second sample and hold signal Vc2 during the period that the ½ frequency clock signal CK/2 is high; selects the first sample and hold signal Vc1 during the period that the ½ frequency clock signal CK/2 is low, and then outputs selectively the first or second sample and hold signal Vc1 or Vc2, selected in accordance with the ½ frequency clock signal CK/2, during the period that the inverted sample and hold clock signal $\overline{CK}$ is low; blocks the output of the sample and hold signals Vc1 and Vc2 during the period that the inverted sample and hold clock signal $\overline{CK}$ is high.

To explain it in more detail, in the second switching circuit 13, when the ½ frequency clock signal CK/2 is low and the inverted sample and hold clock signal $\overline{CK}$ is low, a movable terminal c2 is connected to one fixed terminal a2, thereby allowing the sample and hold signal Vc1 from the first sample and hold condenser C11 to be transferred to the output buffer 14. Also, when the ½ frequency clock signal CK/2 is low and the inverted sample and hold clock signal $\overline{CK}$ is high, the movable terminal c2 is connected to an idle terminal d2, thereby allowing the output from the first sample and hold condenser C11 to be blocked. On the other hand, when the ½ frequency clock signal CK/2 is high and the inverted sample and hold clock signal $\overline{CK}$ is low, the movable terminal c2 is connected to the other fixed terminal b2, thereby allowing the sample and hold signal Vc2 from the second sample and hold condenser C12 to be transferred to the output buffer 14. Also, when the ½ frequency clock signal CK/2 is high and the inverted sample and hold clock signal $\overline{CK}$ is high, the movable terminal c2 is connected to the idle terminal d2, thereby allowing the output from the second sample and hold condenser C12 to be blocked. As described, the movable terminal c2 is selectively switched in sequence to the one fixed terminal a2, the idle terminal d2, the other fixed terminal b2 and the idle terminal d2.

Next, the operation of the sample and hold circuit of the present invention will be described in detail with reference to FIG. 4 and FIGS. 5A through 5F.

First, if the analog input signal Vin as shown in FIG. 5C is applied commonly to the bases of the transistors Q1 and Q2 through the coupling condenser C1, the buffered analog input signal Vin appears at the emitters of the transistors Q1 and Q2. This buffered analog input signal Vin is loaded to the bases of the transistors Q3 and Q4, respectively, through the parallel connected condenser and resistor C2 and R1 and the parallel connected condenser and resistor C3 and R2. At this time, if the ½ frequency clock signal CK/2 is high, the transistrors Q6 and Q7 are turned on. The turning-on of the transistor Q6 causes the analog input signal Vin loaded on the base of the transistor Q4 to be bypassed. The turning-on of the transistor Q7 causes the analog input signal Vin loaded on the base of the transistor Q3 to be outputted at the emitter of the transistor Q3. As a result, the first sample and hold condenser C11 performs the sampling operation of the analog input signal Vin. On the other hand, when the ½ frequency clock signal CK/2 is low, the transistors Q5 and Q8 are turned on, resulting in the sampling operation of the second sample and hold condenser C12.

In other words, when the ½ frequency clock signal CK/2 is high, the first sample and hold condenser C11 performs the sampling operation and the second sample and hold condenser C12 holds a level of the final sampled signal; when the ½ frequency clock signal CK/2 is low, the operations of the first and second sample and hold condensers C11 and C12 are performed on the contrary. At this time, when the inverted sample and hold clock signal $\overline{CK}$ is high because the sample and hold clock signal CK is low, the transistors Q10 and Q14 are turned on and thus the transistors Q9 and Q13 are turned off, thereby causing the outputs Vc1 and Vc2 from the sample and hold condensers C11 and C12 to be blocked. On the other hand, when the inverted sample and hold clock signal $\overline{CK}$ is low because the sample and hold clock signal CK is high, the transistors Q10 and Q14 are turned off. As a result, the transistors Q9 and Q13 are turned on in accordance with the turning-on/off of the transistors Q11 and Q12, thereby allowing the outputs Vc1 and Vc2 from the sample and hold condensers C11 and C12 to be selected.

When the inverted sample and hold clock signal $\overline{CK}$ is low, the transistors Q10 and Q14 are turned off and the ½ frequency clock signal CK/2 is high, the transistor Q9 is turned on as a result of the turning-on of the transistor Q11, thereby allowing the held, output Vc2 from the second sample and hold condenser 012 to appear at the emitter of the transistor Q9. The output Vc2 appearing at the emitter of the transistor Q9 then appears at the base of the transistor Q15 through the diode D1. As a result, the output Vc2 from the second sample and hold condenser C12 is outputted as the output signal Vo at the emitter of the transistor Q15. On the other hand, when the inverted sample and hold clock signal $\overline{CK}$ is low, the transistors Q10 and Q14 are turned off and the ½ frequency clock signal CK/2 is low, the transistor Q13 is turned on as a result of the turning-on of the transistor Q12, thereby allowing the held output Vc1 from the first sample and hold condenser C11 to appear at the emitter of the transistor Q13. The output Vc1 appearing at the emitter of the transistor Q13 then appears at the base of the transistor Q15 through the diode D2. As a result, the output Vc1 from the first sample and hold condenser C11 is outputted as the output signal Vo at the emitter of the transistor Q15.

In result, as the output signal Vo from the output buffer 14, only signals of levels held on the sample and hold condensers C11 and C12 as shown in FIG. 5F are outputted when the sample and hold clock signal CK is high. That is, when the ½ frequency clock signal CK/2 is high and the sample and hold clock signal CK is high, the signal of level held on the second sample and hold condenser C12 is outputted as the output signal Vo from the output buffer 14; when the ½ frequency clock signal CK/2 is low and the sample and hold clock signal CK is high, the signal of level held on the first sample and hold condenser C11 is outputted as the output signal Vo from the output buffer 14. In this manner, the sample and hold condensers C11 and C12 perform the sampling and holding operations in accordance with the ½ frequency clock signal CK/2 into which the sample and hold clock signal CK is frequency-divided by two. Therefore, the sampling and holding period according to the ½ frequency clock signal CK/2 is two times as long as that according to the sample and hold clock signal CK. For this reason, plenty of time for sampling can be provided.

As hereinbefore described, in accordance with the present invention, there is provided the wide-band sample and hold circuit which is capable of sampling and holding the analog input signal by means of two sample and hold condensers in accordance with the ½ frequency clock signal into which the sample and hold clock signal is frequency-divided by two. Therefore, the circuit according to the present invention can have sampling and holding intervals enough to meet a variation of the wide-band analog input signal, resulting in its stabilized sampling operation. For this reason, the capacity of the sample and hold condensers can be selected suitably to the circuit. In result, the reduction of the level of the held signal due to a leakage current can be prevented. Also, the circuit according to the present invention may be applied to systems requiring a high resolution and a high speed operation.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A wide-band sample and hold circuit comprising:
   input buffering means for receiving and buffering an analog input signal and outputting the buffered analog input signal;
   frequency dividing means for frequency-dividing a sample and hold clock signal by a predetermined number and outputting the frequency-divided clock signal;
   first switching means for switching in turn an output signal from said input buffering means to first and second sample and hold means in accordance with said frequency-divided clock signal from said frequency dividing means;
   second Switching means for periodically
      transferring a first sample and hold signal from said first sample and hold means to an output of said second switching means,
      blocking said first sample and hold signal from said output,
      transferring a second sample and hold signal from said second sample and hold means to said output of said second switching means, and
      blocking said second sample and hold signal from said output
      in accordance with said frequency-divided clock signal and sample said sample and hold clock signal; and
   output buffering means for buffering an output signal from said output of said second switching means and outputting the buffered signal as an output signal of said sample and hold circuit.

2. A wide-band sample and hold circuit as set forth in claim 1, wherein said input buffering means comprises:
   a first transistor including its base connected to an analog input signal terminal via a coupling condenser, its collector connected to a source voltage terminal and its emitter connected to a first current source;
   a second transistor including its base connected to said analog input signal terminal via said coupling condenser, its collector connected to said source voltage terminal and its emitter connected to a second current source;
   a third transistor including its base connected to the emitter of said first transistor via parallel connected second condenser and first resistor, its collector connected to said source voltage terminal and its emitter connected to one side of said first sample and hold means, an other side of which is connected to ground; and
   a fourth transistor including its base connected to the emitter of said second transistor via parallel connected third condenser and second resistor, its collector connected to said source voltage terminal and its emitter connected to one side of said second sample and hold means an other side of which is connected to ground.

3. A wide-band sample and hold circuit as set forth in claim 2, wherein said first switching means comprises:
   fifth and sixth transistors including their bases connected respectively to inverted and non-inverted frequency-divided clock signal terminals via third and fourth resistors, their emitters connected commonly to a negative source voltage terminal via a fifth resistor and their collectors connected respectively to the bases of said third and fourth transistors; and
   seventh and eighth transistors including their bases connected respectively to said non-inverted and inverted frequency-divided clock signal terminals, their emitters connected commonly to said negative source voltage terminal via a sixth resistor and their collectors connected respectively to the emitters of said third and fourth transistors.

4. A wide-band sample and hold circuit as set forth in claim 3, wherein said second switching means comprises:
   ninth and tenth transistors including their emitters connected commonly to a third current source and their bases connected respectively to said non-inverted and inverted frequency-divided clock signal terminals;
   eleventh and twelfth transistors including their collectors connected commonly to said source voltage terminal, their bases connected respectively to said one side of said second sample and hold means and an inverted sample and hold clock signal terminal and their emitters connected commonly to the collector of said ninth transistor;
   thirteenth and fourteenth transistors including their collectors connected commonly to said source voltage terminal, their bases connected respectively to said one side of said first sample and hold means and said inverted sample and hold clock signal terminal and their emitters connected commonly to the collector of said tenth transistor; and
   first and second diodes including their anodes connected commonly to said source voltage terminal via a fourth current source and their cathodes connected respectively to the common emitters of said eleventh and twelfth transistors and the common emitters of said thirteenth and fourteenth transistors, whereby said second switching means applies the switched output to said output buffering means through a connection of the common anodes of said first and second diodes with said fourth current source.

5. A wide-band sample and hold circuit as set forth in claim 4, wherein said output buffering means comprises:
a fifteenth transistor including its base connected to the common anode connection of said first and second diodes, its collector connected to said source voltage terminal and its emitter connected to a sample and hold output signal terminal and also connected to said negative source voltage terminal via a connection of the emitter of said fifteenth transistor with said sample and hold output signal terminal and via a fifth current source.

* * * * *